(12) United States Patent
Shah et al.

(10) Patent No.: US 10,197,624 B2
(45) Date of Patent: Feb. 5, 2019

(54) COMPACT PACKAGE ASSEMBLY AND METHODS FOR THE SAME

(71) Applicant: Intel Corporation, Santa Clara, CA (US)

(72) Inventors: Pritulkumar Shah, Redmond, WA (US); Michael Likov, Givatayim (IL); Frank R. Deweese, McMinnville, OR (US)

(73) Assignee: Intel Corporation, Santa Clara, CA (US)

( * ) Notice: Subject to any disclaimer, the term of this patent is extended or adjusted under 35 U.S.C. 154(b) by 208 days.

(21) Appl. No.: 14/975,223

(22) Filed: Dec. 18, 2015

(65) Prior Publication Data

US 2017/0181284 A1 Jun. 22, 2017

(51) Int. Cl.
*G01R 31/28* (2006.01)
*G01R 1/04* (2006.01)

(52) U.S. Cl.
CPC ....... *G01R 31/2896* (2013.01); *G01R 1/0408* (2013.01)

(58) Field of Classification Search
CPC ... H05K 1/11; H05K 1/16; H05K 1/18; H05K 1/181; H05K 1/182; H05K 1/183; H05K 1/186; H05K 2201/09218; H05K 2201/09227; H05K 2201/09236; H05K 2201/09245; H05K 2201/09254; H05K 2201/09263; H05K 2201/09272; H05K 2201/0929; H05K 2201/093; H05K 2201/09309; H05K 2201/09318; H05K 2201/09327; H05K 2201/09336; H05K 2201/09345; H05K 2201/09354; H05K 2201/09363; H05K 2201/09372; H05K 2201/09381; H05K 2201/09418; H05K 2201/09427; H05K 2201/09436; H05K 2201/09445; H05K 2201/09454; H05K 2201/09463; H05K 2201/09472; H05K 2201/09481; H05K 2201/0949; H05K 2201/095; H05K 2201/09509; H05K 2201/09518; H05K 2201/09536;
(Continued)

(56) References Cited

U.S. PATENT DOCUMENTS 6,058,014 A * 5/2000 Choudhury ............ H05K 3/325
257/719
6,781,838 B2 * 8/2004 Shinotou ............. H01L 23/4093
165/80.3

(Continued)

*Primary Examiner* — Pete T Lee
(74) *Attorney, Agent, or Firm* — Schwegman Lundberg & Woessner, P.A.

(57) ABSTRACT

A package assembly includes a device package having a package perimeter footprint. A package riser is coupled with the device package. The package riser includes a riser body having a riser perimeter footprint corresponding to the package perimeter footprint. The riser body includes a package face coupled with the device package and an opposed platform face. A riser flange is proximate to the package face. The riser flange extends from the riser body. A package clamp is coupled with the device package and the package riser. The package clamp includes a clamp face coupled with the device package, and one or more clamp legs clamped to the riser flange. The device package is clamped between the clamp face and the package face.

27 Claims, 9 Drawing Sheets

(58) Field of Classification Search
CPC .......... H05K 2201/09545; H05K 2201/09554;
H05K 2201/09563; H05K 2201/09572;
H05K 2201/09581; H05K 2201/0959;
H05K 2201/096; H05K 2201/09609;
H05K 2201/09618; H05K 2201/09627;
H05K 2201/09636; G01R 31/2896; G01R
1/0408
See application file for complete search history.

(56) References Cited

U.S. PATENT DOCUMENTS

| | | | | |
|---|---|---|---|---|
| 2004/0018753 | A1* | 1/2004 | Kung | H05K 3/325 |
| | | | | 439/66 |
| 2004/0228095 | A1* | 11/2004 | Lee | H01L 23/4093 |
| | | | | 361/704 |
| 2006/0274503 | A1* | 12/2006 | Lee | H01L 23/4093 |
| | | | | 361/704 |

* cited by examiner

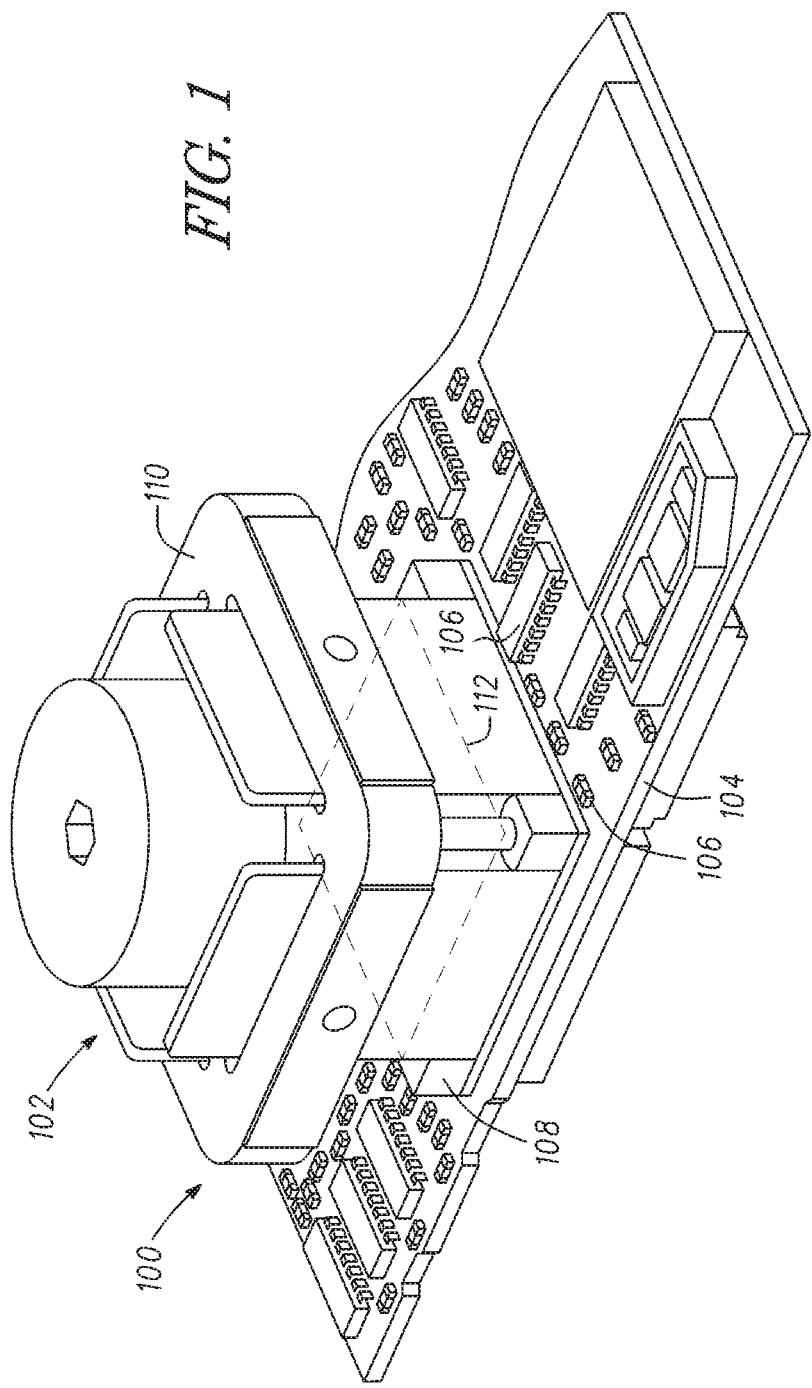

COMPACT PACKAGE ASSEMBLY AND METHODS FOR THE SAME

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the drawings that form a part of this document: Copyright Intel Corporation, Santa Clara, Calif. All Rights Reserved.

TECHNICAL FIELD

Embodiments described herein generally relate to coupling and retention of packages with an underlying component.

BACKGROUND

Device packages including one or more of CPUs or SOCs (System on a chip) are coupled with platforms, such as motherboards, printed circuit boards or the like. For installation of the device packages a plurality of semi-permanent couplings are formed between the platforms and the device packages. For instance, solder contacts are provided therebetween and subject to reflow (e.g., elevated temperatures that cause the solder to reflow) to provide robust mechanical and electrical couplings.

In testing either or both of device packages and platforms are exchanged. For instance, in validation and debugging, a device package is installed on the platform and then the assembled platform and device package are subjected to a battery of tests. Errors in the assembly detected with the tests are isolated between the device package and the platform by exchanging the installed device package with a replacement package and conducting the same or different tests. By process of elimination it is determined whether errors are present in the platform or the device package.

In some examples, the platform includes a socketed interface. The socketed interface is provided in a specially designed platform that includes one or more of an interface frame (sized and shaped for reception of device packages), a back plate coupled to an opposed surface of the platform to support the interface frame, fastener orifices formed in the platform and a device package provided in a fixture. The fixture is buckled to the platform at the interface frame with a plurality of fasteners, such as screws, extending through the fastener orifices. Tightening of the fasteners through the interface frame couples the electrical contacts of the device package with electrical contacts of the platform (e.g., without solder). To exchange the device package for a replacement package, the fasteners are loosened and the previously installed device package in the interface frame is removed and replaced.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 is a perspective view of one example of a package assembly coupled with a platform.

DESCRIPTION OF EMBODIMENTS

Figure 2A:
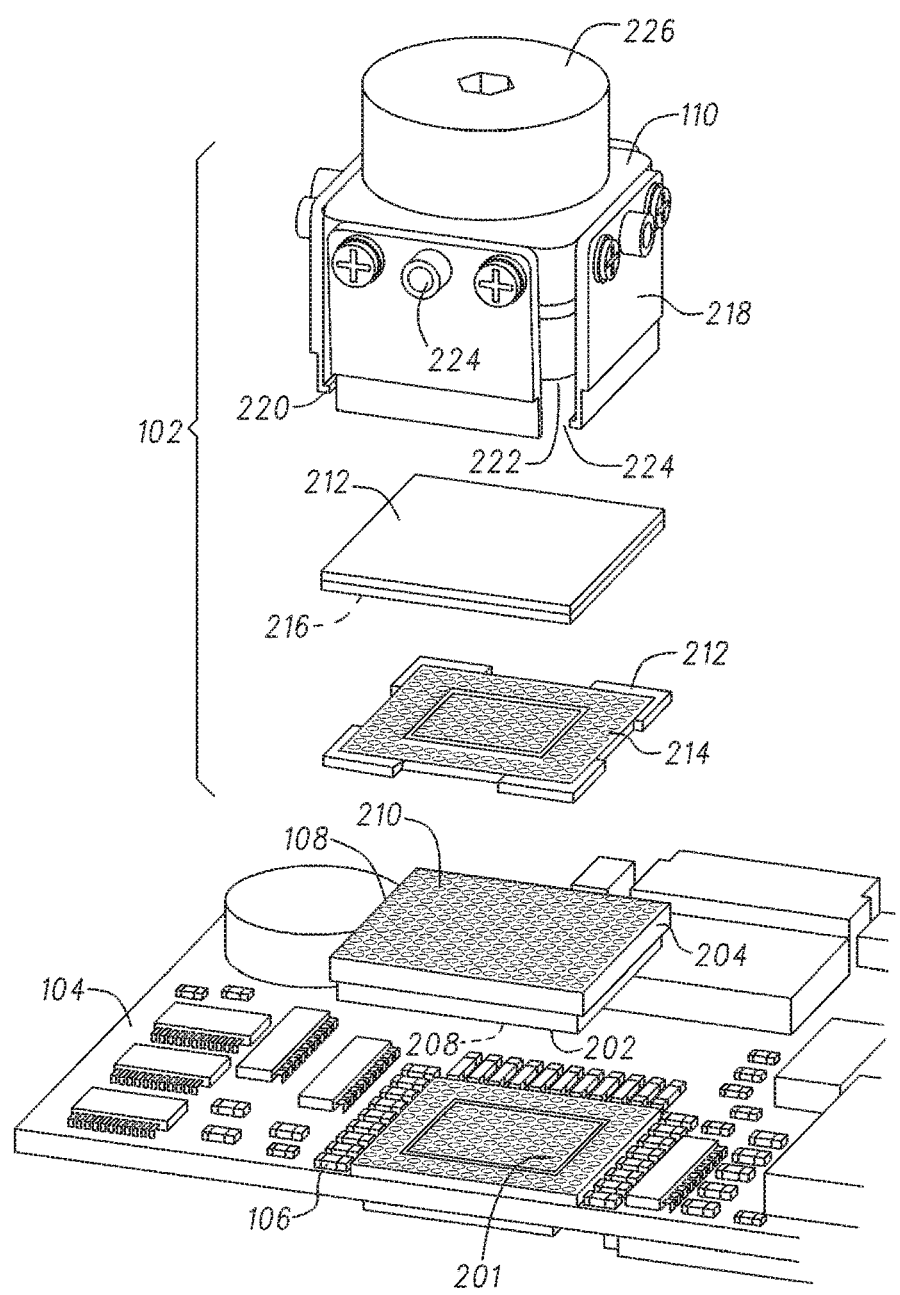
FIG. 2A is an exploded view of another example of the package assembly.

The present inventors have recognized, among other things, that a problem to be solved can include, minimizing or removing the need for customized platforms to facilitate the ready exchange of device packages for one or more of validation, debugging or replacement with updated or different packages. Customized platforms include one or more of socket interfaces, back plates, fastener orifices or the like that increase the overall footprint (surface area on the platform) of the device package. The enlarged overall footprint of socketed interfaces takes up valuable space on the platform and requires rerouting of traces, repositioning of platform components and the like relative to a standard (nontesting) platform. Further, after testing with the customized (test) platform a standard platform design having solder connections between the platform and the device package is then fashioned adding additional labor and time to production.

The present subject matter can help provide a solution to this problem with a package assembly including a package riser configured for coupling with the platform. The package riser includes a riser perimeter footprint corresponding to the package perimeter footprint. Stated another way, the package riser and the device package, when installed on the package riser, have a corresponding composite footprint that has the compact footprint of the device package. The package riser is coupled at the device package platform location (e.g., with reflowed solder contacts), and because the package riser has a corresponding footprint to the device package the location does not assume extra space on the platform. The device package is coupled with the riser, for instance with an interposing deformable socket interface. A package clamp is coupled along the device package and coupled with the package riser. The device package is clamped to the platform riser (and its electrical contacts) with the package clamp. In an example the package riser includes a riser flange and one or more clamp legs are coupled with the riser flange. The riser flange extends from a riser body of the package riser (e.g., extends outside of the perimeter of the riser body or is provided in one or more recesses around the riser body). The package riser elevates the riser flange away from the platform and the coupling of the one or more clamp legs with the riser flange is isolated from proximate components of the platform that surround the package riser and the device package.

Accordingly, with the package assembly examples described herein customized platforms having enlarged device package platform locations (e.g., for socket interfaces, back plates or the like) to facilitate the exchange of device packages are not used. The coupling of the package clamp and the package riser is above the components of the platform and isolated from the surrounding components of the platform. That is to say, the package assembly examples maintain the device package footprint realized with solder coupling of device packages to the platform while allowing for ready exchange of packages in a compact form factor. The package assembly allows for the ready exchange of device packages through removal of the package clamp and replacement with another device package again in a compact overall footprint and without requiring breaking of solder contacts and resoldering of the device package. Labor intensive and expensive redesigns of standard platforms from a customized testing or debugging platform are accordingly avoided with the package assembly examples. Instead, a single platform design is used for debugging and production when used in combination with the package assembly examples described herein. Time to production and market is thereby accelerated. Further, the debugging process with a standard platform, in contrast to a debugging platform and later designed standard platform, is straightforward and provides more accurate and reliable testing as the production design matches the debugging design (i.e., the platforms are identical).

Furthermore, the package assembly examples described herein provide the compact form factor (e.g., footprint) in all platforms and not just platforms used for validation and debugging. For instance, assembled platforms and device packages maintained in inventory (e.g., thousands of assemblies) each include the package assembly examples described herein having compact (e.g., device package size) footprints. If replacement of the device packages (e.g., with updated device designs) is desired the installed device packages are readily removed and replaced with updated device packages. Costly and labor intensive disassembly of the existing device packages including breaking of solder contacts, refurbishing of platforms, and reflowing of solder contacts for replacement packages is not needed. Instead, the package risers facilitate the ready decoupling of existing device packages with unclamping from the package risers and replacement with updated device packages. The existing device packages are also reusable with package risers of other platforms through clamping of the package clamps. Accordingly, inventories of platforms and device packages are maintained with minimized risk of obsolescence because of the reconfiguration benefits of the package assemblies.

This overview is intended to provide an overview of subject matter of the present patent application. It is not intended to provide an exclusive or exhaustive explanation of the invention. The detailed description is included to provide further information about the present patent application.

FIG. 1 shows a perspective view of one example of an assembled system 100. As shown the assembled system 100 includes a package assembly 102 coupled with a platform 104. In one example, the platform 104 includes, but is not limited to, a motherboard, printed circuit board or the like. As shown the platform 104 includes a plurality of platform components 106 some of which are provided proximate (e.g., immediately adjacent) the package assembly 102.

As will be described herein, the package assembly 102 provides a fixture for coupling a package such as the device package 112 shown in broken lines in FIG. 1 with the platform 104. The package assembly 102 provides a readily removable system configured to provide robust mechanical and electrical coupling between the device package 112 and a corresponding location on the platform 104. The package assembly 102 provides this coupling with the platform 104 while maintaining a perimeter or footprint corresponding to the perimeter footprint of the device package 112.

As shown in FIG. 1, the package assembly 102 includes a package riser 108. As shown the package riser 108 is coupled with the platform 104. For instance, the package riser 108 includes a plurality of riser contacts configured for coupling with the platform 104 as well as the device package 112. In one example, the package riser 108 is coupled with the platform 104 with a plurality of riser contacts provided along a package face of the package riser 108. The contacts provided along the package face of the package riser 108 are soldered, in one example, to corresponding contacts on the platform 104.

The device package 112 (e.g., a CPU, system on a chip or the like) is provided within the package assembly 102 for instance between a package clamp 110 and the package riser 108. The device package 112 as described herein also includes a plurality of package contacts configured for electrical coupling with corresponding riser contacts of the package riser 108. The package riser 108 thereby provides an interface between the platform 104 and the device package 112. As further shown in FIG. 1, a package clamp 110 is coupled with the device package 112 and the package riser 108. As described herein, the package clamp 110 provides a clamping engagement with the package riser 108 that robustly couples and retains the device package 112 in mechanical and electrical contact with the platform 104. As will be described herein, the package clamp 110 includes one or more features configured to couple with the package riser 108 and couple the device package 112 therebetween. The coupling between the package riser 108 and the package clamp 110 is at a location spaced from the platform components 106 to allow for positioning of the platform components 106 in close proximity to the device package 112.

Figure 2B:
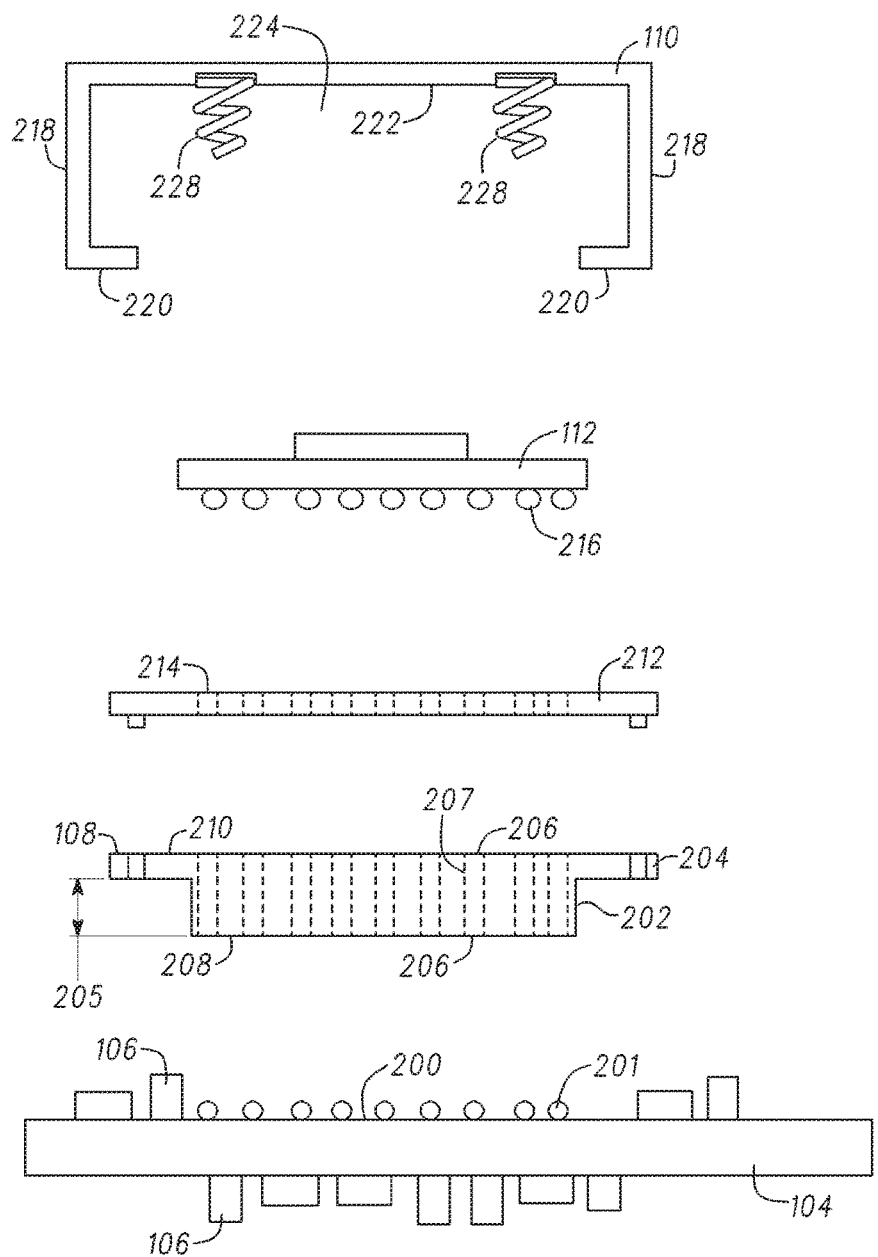
FIG. 2B is a schematic exploded view of the package assembly.

FIGS. 2A and 2B show respective exploded and schematic views of the package assembly 102 and platform 104 previously shown in FIG. 1. Referring first to FIG. 2A, the package assembly 102 is shown in an exploded configuration relative to the platform 104. As shown the platform 104 includes a package footing 200 configured for coupling with a device package. The package footing 200 has a footing perimeter footprint corresponding to a package perimeter footprint of the device package 112. In one example, the footing perimeter footprint and the package perimeter footprint of the respective package footing 200 and device package 112 correspond to the outer dimensions of the respective components. That is to say, the footing perimeter footprint of the package footing 200 is a corresponding shape, size and the like relative to the package perimeter footprint of the device package 112. The package footing 200 further includes a plurality of footing contacts 201 that provide electrical communication with the device package 112 by way of the package riser 108.

As further shown in FIG. 2A (as well as FIG. 2B), the package riser 108 is positioned above the package footing 200. As shown, the package riser 108 includes a platform face 208 facing the package footing 200 and a package face 210 facing the device package 112. The package riser 108 further includes a riser body 202 having a riser perimeter footprint corresponding to the package perimeter footprint and footing perimeter footprint as shown in FIG. 2A. Accordingly, the riser body 202 when installed on the package footing 200 assumes a substantially similar footprint to the footing perimeter footprint of the package footing 200. The package riser 108 further includes a riser flange 204 extending away from the riser body 202. As will be described herein and as shown in FIG. 2A, the riser flange 204 is adjacent to the package face 210 and spaced from the platform face 208. The riser flange 204 facilitates the coupling of the package clamp 110 with the package riser 108. Further, the riser flange 204 positions the coupling of the package clamp 110 with the package riser 108 at a location above the platform components 106 arrayed around the package footing 200. Accordingly, and as described herein, the platform components 106 are in one example positioned proximate (e.g., immediately adjacent) to the package footing 200. As further shown in FIG. 2A, the package riser 108 includes one or more riser contacts 206 provided at each of the package face 210 and the platform face 208. Corresponding conductive traces extend between the riser contacts 206 at the package and platform faces 210, 208 to provide an electrical interface from the package footing 200 to the device package 112. In one example, the package riser 108 is coupled with the package footing 200 by way of solder contacts (e.g., reflowed solder contacts) between the footing contacts 201 and the riser contacts 206 provided on the platform face 208. The solder contacts provided between the package riser 108 and the package footing 200 provide a robust electrical and mechanical coupling therebetween. As described herein, the device package 112 is coupled with the robustly coupled package riser by way of the package clamp 110 and is readily removable while the package riser 108 remains with the platform 104.

As further shown in FIG. 2A and FIG. 2B, a socket interface 212 is optionally provided between the device package 112 and the package riser 108. The socket interface 212, in a similar manner to the package riser 108, includes a plurality of socket contacts 214. The socket contacts 214 provide a conductive interface between the package riser 108 and the device package 112 (e.g., package contacts 216). In one example, the socket interface 212 is formed with a deformable material configured to deflect as pressure is applied on the socket interface 212 during clamping of the package clamp 110 to the package riser 108. Force applied between the package clamp 110 and the package riser 108 to the device package 112 causes deflection of the socket interface 212. Deformation of the socket interface 212 ensures intimate contact between the package contacts 216 and the socket contacts 214. That is to say, the socket interface 212 readily deflects with clamping and is biased into intimate contact with the package contacts 216 of the device package 112. In another example, the package assembly 102 does not include the socket interface 212 and the package assembly relies on the clamping force provided between the package clamp 110 and the package riser 108 to bias the package contacts 216 of the device package 112 into an intimate interface with the riser contacts 206 along the package face 210.

The device package 112 described herein includes one or more arrangements of components on a substrate. For instance, the device package 112 includes, but is not limited to, one or more dice, devices or the like provided on a substrate for including a multilayered substrate having patterned insulating layers, conductive traces and vias or the like. In one example, the device package 112 includes at least one CPU, a system on a chip (SOC) or the like.

Referring again to FIG. 2A, one example of the package clamp 110 is shown. In this example, the package clamp 110 includes a plurality of clamp legs 218 extending from a central body, for instance including a clamp face 222. As further shown, the clamp legs 218 include, in this example, one or more clamp hooks 220. As will be described herein, the clamp hooks 220 provide a hooking coupling with the riser flange 204 of the package riser 108. The coupling between the clamp hooks 220 and the riser flange 204 occurs at an elevated position relative to the platform 104 including a plurality of platform components 106. The spacing of the riser flange 204 and the coupling of the clamp hook 220 with the riser flange 204 facilitates the close positioning of the platform components 106 to the device package 112 while also allowing for ready removal of the device package 112, for instance by loosening and removal of the package clamp 110.

As further shown in FIG. 2A, the clamp legs 218 extend around a package recess 224. In one example, the package recess 224 is sized and shaped to receive the device package 112 therein, for instance prior to installation of the package clamp 110. The device package 112 is fit within the package recess 224 and the assembly of the package clamp 110 and the device package 112 is coupled with the package riser 108. In another example, the package recess 224 is surrounded by the one or more clamp legs 218 and the clamp face 222. The clamp face 222 is engaged along the device package 112 when the device package is positioned within the package recess 224.

As further shown in FIG. 2A, in at least one example the package clamp 110 includes a coupling operator 224. In an example the package clamp 110 includes multiple coupling operators 224 including for instance fasteners, bolts or the like configured to move the clamp legs 218 and couple the clamp legs with the package riser 108 (e.g., along the riser flange 204). In another example, the package clamp 110 includes a clamp operator 226. As shown in FIG. 2A, in an example the clamp operator 226 includes a knob, twistable feature or the like configured to rotate relative to the package clamp 110. In this example, rotation of the clamp operator 226 biases a portion of the package clamp 110 such as the clamp face 222 downward relative to the clamp legs 218. The downward movement of the clamp face 222 pushes the device package 110 into an intimate interface with one or more of the socket interface 212 or the package riser 108 including the socket contacts 214 and riser contacts 206, respectively. That is to say, the clamp operator 226 in one example is used to clamp the device package 112 between the package clamp 110 and the package riser 108 to provide a robust electrical and mechanical coupling between the device package 112 and the platform 104 by way of the package riser 108.

FIG. 2B shows another schematic example of the package assembly 102 in an exploded configuration. As shown in FIG. 2B, the package assembly 102 as well as the platform 104 are shown in a schematic format. For instance, the package clamp 110 includes the clamp face 222 sized and shaped for coupling with the device package 112 and one or more clamp legs 218 extending from the clamp face 222. As previously described, the clamp legs 218 in one example include clamp hooks 220 sized and shaped for coupling with the riser flange 204 of the package riser 108. As further shown in FIG. 2B, the package clamp 110 includes one or more biasing elements 228. In the example shown, two biasing elements 228 are provided. In another example, the package clamp 110 includes a single biasing element, for instance a feature like the clamp operator 226 shown in FIG. 2A. That is to say, the clamp operator 226 is one example of a biasing element configured to bias the device package 112 toward the package riser 108 and the platform 104 including the plurality of contacts providing the interface between the device package 112 and the platform 104, such as one or more of the socket contacts 214, riser contacts 206 or the like. In another example, the biasing elements 228 include one or more biasing features, for instance elastomeric materials, springs or the like configured to bias the device package 112 toward the platform 104.

As further shown in FIG. 2B, the package assembly 102 provides a chain of contacts and conductive traces configured to provide communication between the device package 112 and the underlying platform 104. For instance, the device package 112, in one example, is coupled along the socket interface 212 (e.g., a deformable socket interface). The socket interface 212 includes a plurality of socket contacts 214. As the package clamp 110 is clamped with the package riser 108, the device package 112 is compressed between the package riser 108 and the package clamp 110. The compression therebetween biases the device package 112 into engagement with the socket interface 212 and accordingly deforms the socket interface and ensures reliable robust electrical contact between the package contacts 216 and the socket contacts 214. Similarly, the coupling of the socket interface 212 with the package riser 108 ensures coupling of the socket contacts 214 (for instance, along the lower face of the socket interface 212) with the riser contacts 206 along the package face 210. As further shown in FIG. 2B, the package riser 108 includes a plurality of conductive traces 207 providing communication with the riser contacts 206 along the package face 210 and the riser contacts 206 along the platform face 208. The interface is continued to a plurality of footing contacts 201 provided at the package footing 200. In one example, the riser contacts 206 and the footing contacts 201 are coupled together with one or more semi-permanent coupling features for instance a plurality of solder dots provided along the platform 104 and reflowed (through heating at high temperatures) to provide a robust electrical and mechanical coupling between the package riser 108 and the platform 104. Optionally, and as described herein, the socket interface 212 is absent from the package assembly 102 and the device package 112 is directly coupled with the package riser 108. Clamping of the device package 112 between the package clamp 110 and the package riser 108 biases the package contacts 216 into intimate and reliable coupling with the riser contacts 206 along the package face 210. As further shown in FIG. 2B, the package riser 108 includes a flange gap 205 between the platform face 208 and the riser flange 204. As previously described herein, the riser flange 204 is, in one example, spaced from the platform face 208 to ensure the riser perimeter footprint of the package riser 108, for instance corresponding to the outer dimensions and shape of the riser body 202, corresponds (e.g., matches is identical to, nearly identical to or substantially the same as or the like) to the footing perimeter footprint of the package footing 200. Accordingly, with the riser flange 204 at an elevated position platform components 106 are readily positioned proximate to the package footing 200. As shown for example in FIG. 2B, the platform components 106 are configured for reception within the flange gap 205 after coupling of the package riser 108 with the package footing 200. Accordingly, the platform 104 is, in one example, designed with the platform components 106 proximate (e.g., immediately adjacent) to the package footing 200. The allocation of space and redesign of the platform 104 for instance for larger fixture assemblies is thereby avoided. As further shown in FIG. 2B, platform components 106 are also provided along a lower surface of the platform 104 in another example. As previously described herein, because the package assembly 102 does not use large fixtures (relative to the package footprint perimeter) formed or coupled with the platform 104 including back plates or the like additional platform components 106 are optionally provided along a lower surface of the platform 104, for instance beneath the package footing 200. Features such as back plates, back frames or the like otherwise coupled with the platform 104 to support fixtures are thereby avoided.

Figure 3:
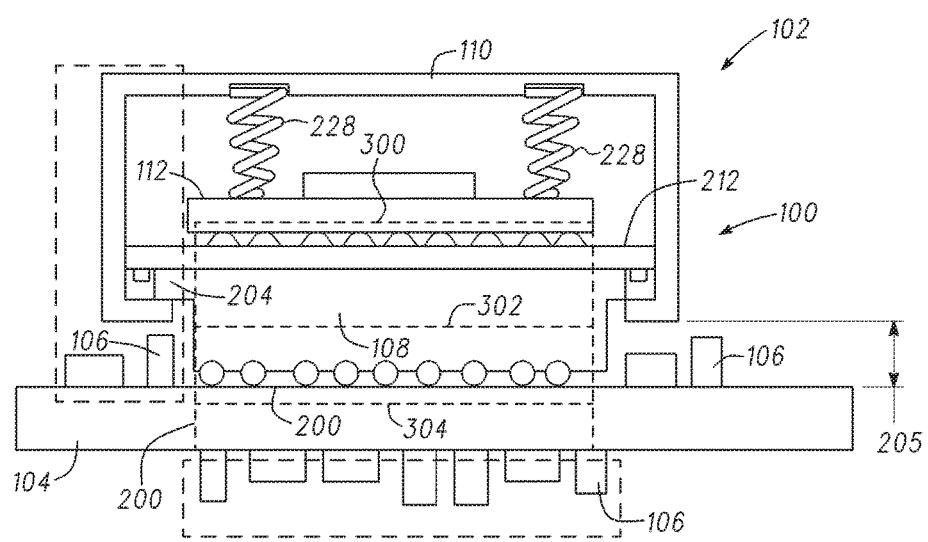
FIG. 3 is a schematic view of the package assembly of FIG. 2B coupled with the platform.

FIG. 3 shows the schematic package assembly 102 previously shown in FIG. 2B assembled with the platform 104, for instance to form an assembled system 100 (e.g., the installed configuration, also see FIG. 1). As shown, the package clamp 110, including one or more clamp legs 218 and clamp hooks 220, is coupled with the package riser 108 for instance along the riser flange 204. The interface between the package clamp 110 and the package riser 108 is provided relatively above the platform 104 and above the platform components 106 proximate to the package riser 108 and the package footing 200. As previously described, the flange gap 205 provides a space between the coupling of the package riser 108 and the package clamp 110 to facilitate the positioning of platform components 106 proximately as shown in FIG. 3. Further, because the package assembly 102 provides the coupling between the device package 112 and the platform 104 along the upper face of the platform 104 without fixtures requiring buckling or fastening through the platform 104, the lower surface of the platform 104 remains open and is thereby available for platform components 106 as well. As shown in FIG. 3, the dashed outlines to the left of the package assembly 102 (as well as to the right but undashed) and below the platform 104 show the freed space along the platform 104 open with use of the package assembly 102.

As further shown in FIG. 3, the footprints of the components of the package assembly 102, including for instance the device package 112, the package riser 108 as well as the footing perimeter footprint of the package footing 200, have a corresponding shape and size. For instance as shown in FIG. 3, the package perimeter footprint 300, the riser perimeter footprint 302 and the footing perimeter footprint 304 have a corresponding shape and size (e.g., as shown on the page and extending into and out of the page). When assembled, for instance into the package assembly 102 and coupled with the platform 104, the footprints of these components overlie each other and are corresponding (e.g., identical, nearly identical or substantially the same). Accordingly, the package assembly 102, while allowing for removable coupling of the device package 112 with the platform 104, assumes substantially the same amount of space as other larger fixture assemblies used to removably couple device packages with platforms. Accordingly, large frames, back plates, fastener holes and the like, otherwise provided in other exemplary platforms, are avoided with use of the package assembly 102 as described herein.

Figure 4A:
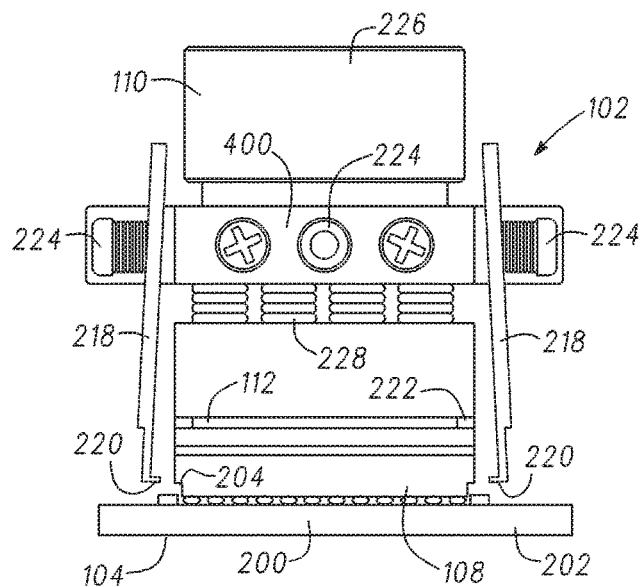
FIG. 4A is a side view of the package assembly of FIG. 2A with a coupling operator configured to operate a package clamp.
Figure 4B:
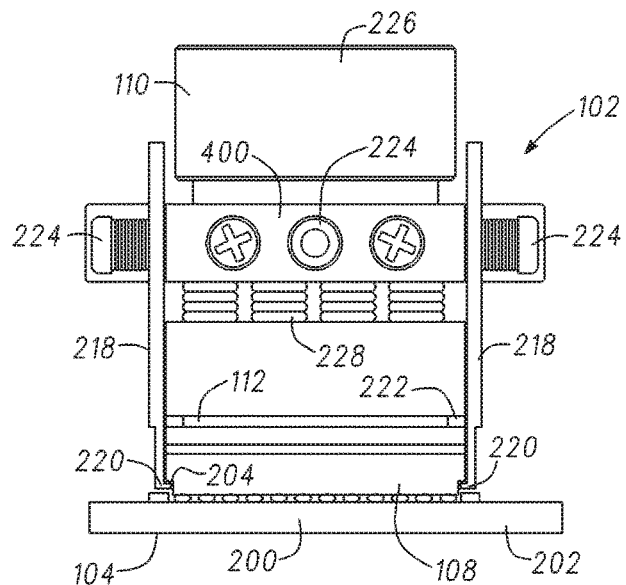
FIG. 4B is a side view of the package assembly of FIG. 2A with a clamp operator configured to clamp a package device.

FIGS. 4A and 4B show the package assembly 102 in an assembled configuration with the platform 104. Referring first to FIG. 4A, the package clamp 110 is shown in a loosened configuration, for instance with the riser flange 204 uncoupled from the clamp legs 218. The package clamp 110 is provided over top of the device package 112 with the package riser 108 thereunder. As previously described herein, the package riser 108 is coupled with the platform 104. When coupling of the package clamp 110 to the package riser 108 is desired, one or more coupling operators 224 are operated to move the clamp legs 218 into a coupling relationship with the package riser 108 for instance the riser flange 204. In one example, the coupling operator 224 includes one or more thumb screws, fasteners or the like extending through the clamp legs 218. Rotation of the coupling operator 224 in such an example moves the clamp legs 218 in an inward fashion and accordingly hooks the clamp hooks 220 underneath the riser flange 204. Once the clamp legs 218 are coupled with the riser flange 204 (e.g., with the clamp hooks 220 positioned along the riser flange 204) the package clamp 110 is coupled with the package riser 108 and the device package 112 is ready for clamping therebetween. Optionally, the coupling operator includes, but is not limited to, the features previously described herein, one or more biasing features such as springs that bias the clamp legs 218 toward the riser flange 204 or the like. Further, the package clamp 110 is shown in the example with one or more clamp legs 218. In another example, the package clamp 110 includes other types of clamp legs, including but not limited to, clamp legs provided as jaws in a three jaw chuck or other chuck configured to couple wht package clamp with the package riser 108.

Referring now to FIG. 4B, the package clamp 110 is shown in the coupled configuration with the clamp legs 218 coupled with the package riser 108. As shown the clamp legs are coupled with the riser flange 204. In one example, the clamp hooks 220 are positioned underneath or coupled along the riser flange 204. As further shown in FIG. 4B, the package clamp 110, in one example, includes a clamp body 400 coupled with the clamp face 222 for instance with one or more biasing elements 228 therebetween. A clamp operator 226 is coupled with the clamp body 400. In one example, the clamp operator 226 is rotatable relative to the clamp body 400 for instance with a threaded engagement therebetween (e.g., a threaded shaft received within a threaded orifice of the clamp body). The clamp operator 226, when rotated or otherwise operated, biases the clamp face 222 toward the device package 112 and accordingly compresses the device package 112 between the clamp face 222 and the package riser 108. As previously described herein, the clamping of the device package 112 ensures reliable and robust electrical and mechanical coupling between the device package 112 and the interposing features between the package and the platform 104 including for instance the package riser 108 and the optional socket interface 212.

Operation of the clamp operator 226 for instance by rotation, in one example, drives the clamp face 222 relative to the clamp body 400 and accordingly presses the device package 112 toward the package riser 108 and compresses the device package 112 between the clamp face 222 and the package riser 108. That is to say, with the coupled engagement of the clamp legs 218 to the package riser 108 (e.g., the riser flange 204) movement to the clamp face 222 downward accordingly compresses the device package 112 and ensures a reliable and robust electrical and mechanical coupling.

In another example, the operation of the clamp operator 226 passively operates the clamp face 222. For instance, as the clamp face 222 moves away from the clamp body 400 (with operation of the clamp operator 226) it is the biasing elements 228 that bias the clamp face 222 toward the device package 112. That is to say, the biasing elements 228 are, in one example, held in a compressed state by the coupling of the clamp operator 226 to the clamp face 222 for instance with the clamp body 400 therebetween. As the clamp operator 226 is actuated, the positioning of the clamp face 222 is relaxed relative to the clamp body 400 and the compressed biasing elements 228 accordingly bias the clamp face 222 toward the device package 112. In such an example, the exemplary biasing elements 228 provide a plurality of distributed forces around the clamp face 222 to ensure a distributed force is similarly applied to the device package 112 to ensure reliable and robust coupling of the device package 112 across each of the contacts (for instance of the package riser 108 or the optional deformable socket interface 212).

In yet another example, the biasing elements 228 (where included) are held in tension for instance as the clamp face 222 is moved into a clamping configuration with the package riser 108 to accordingly compress the device package 112 therebetween. That is to say, the clamp operator 226 actively moves the clamp face 222 away from the clamp body 400 to accordingly clamp the device package 112 between the clamp face 222 and the package riser 108. Where decoupling of the package clamp 110 is desired, the clamp operator 226 is moved in an opposed fashion that accordingly relaxes the engagement between the clamp operator 226 and the clamp face 222. The tension in the biasing elements 228 pulls the clamp face 222 away from the device package 112 and ensures decoupling of the clamp face 222 from the device package 112 prior to removal of the package clamp 110 from the package riser 108 and the platform 104.

Figure 5:
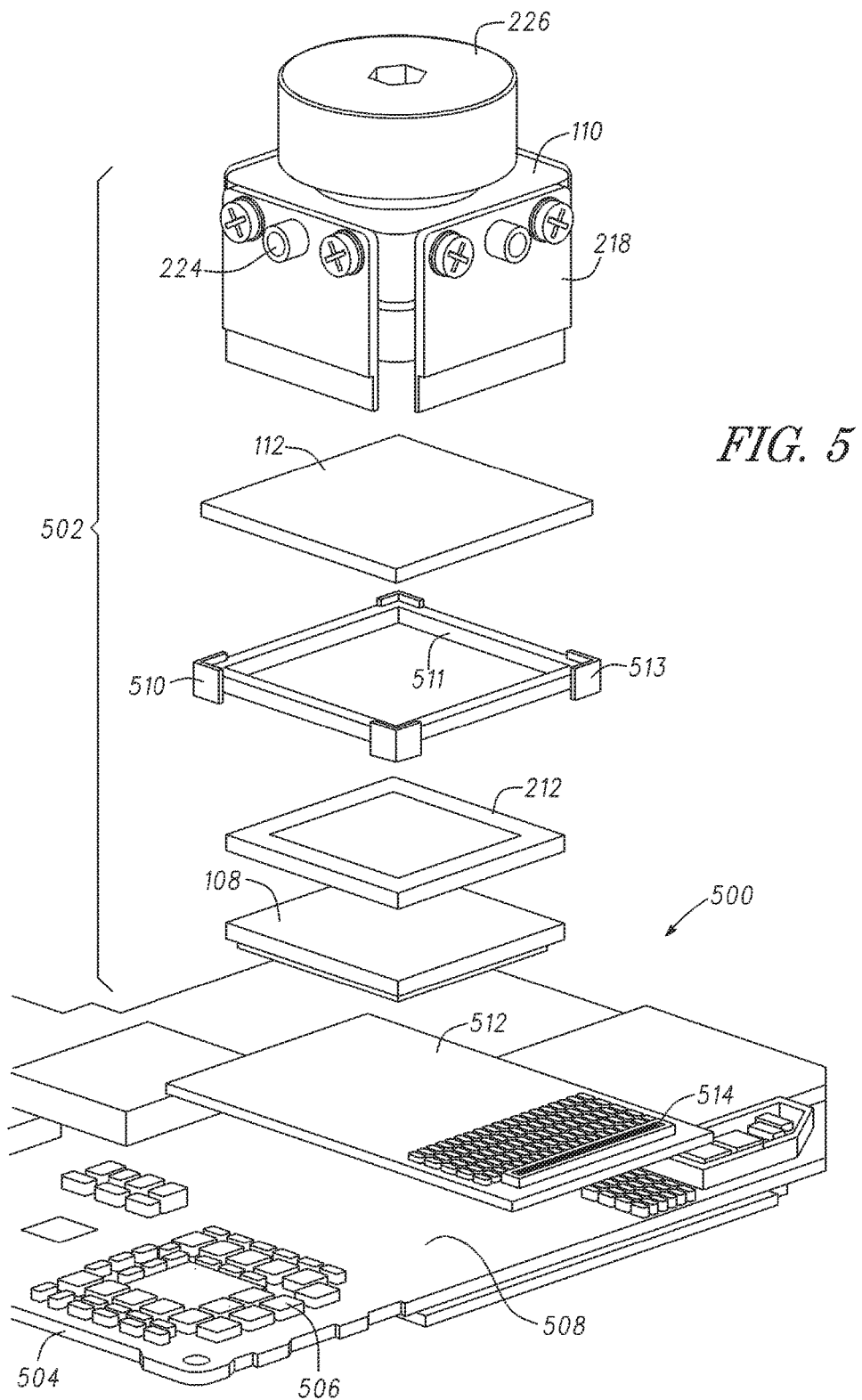
FIG. 5 is an exploded view showing yet another example of a package assembly.

FIG. 5 shows an exploded view of another example of a package assembly 502. As shown, the package assembly 502 with the platform 504 form a system 500. In at least some regards, the package assembly 502 is similar to the previously described package assembly 102. For instance, the package assembly 502 includes a package riser 108, an optional socket interface 212, a device package 112 and a package clamp 110. As shown in FIG. 5, the package clamp 110 includes one or more of a clamp operator 226 and a coupling operator 224. The package clamp 110 further includes one or more clamp legs 218 configured for coupling with the package riser 108 (e.g., as described herein).

Two additional exemplary components are provided in FIG. 5. For instance, an optional alignment frame 510 is provided between the package riser 108 and the device package 112. Additionally, an optional interposer board is provided in this example between the package riser 108 and the package footing 508 of the platform 504. Referring first to the alignment frame 510, as shown the alignment frame in this example includes a plurality of guiding features for instance frame legs 513 extending along the package assembly 502 (when the package assembly 502 is assembled). As further shown in FIG. 5, the alignment frame 510 includes a frame inner perimeter 511. The frame inner perimeter 511 extends, in this example, between the frame legs 513 and provides an alignment feature configured to couple with one or more of the device package 112, the optional socket interface 212 and the like.

In operation, the alignment frame 510 is placed on top of the package riser 108 (previously installed on the package footing 508). The frame legs 513 extend along the package riser 108 for instance along corners of the riser flange 204 (see FIG. 2). With the frame legs 513 positioned around the package riser 108, the frame inner perimeter 511 rests adjacent to the package riser 108. During installation of the device package 112 or the package clamp 110 with the device package 112 the device package 112 is positioned within the frame inner perimeter 511 and automatically aligned with the contacts on the package riser 108 according to the frame inner perimeter 511 and the positioning of the frame legs 513 on the package riser 108. That is to say, the device package 112, including its package contacts 216 (see FIG. 2B), are automatically aligned with the riser contacts 206 (also see FIG. 2B) as the device package 112 is positioned within the frame inner perimeter 511 of the alignment frame 510. In another example, the frame legs 513 are exchanged for or used in combination with other alignment features including for instance posts, clips or the like sized and shaped for reception within corresponding portions of the package riser 108. The frame legs or other alignment features align the frame inner perimeter 511 and facilitate the automatic alignment of the device package 112 prior to full assembly of the package assembly 502 including for instance coupling of the package clamp 110 and compressing of the device package 112 between the package clamp 110 and the package riser 108.

As further shown in FIG. 5, an interposer board 512 is shown in the example as a component of the package assembly 502. Although shown in FIG. 5 with the interposer board 512 positioned between the package footing 508 and the package riser 108, in another example, the interposer board 512 is positioned over the package riser 108 for instance between the device package 112 and the package riser 108. Positioning of the interposer board 512 above the package riser 108 elevates the interposer board 512 and facilitates the use of an interposer perimeter footprint larger than the footing perimeter footprint available at the package footing 508. As previously described, the platform components, for instance the platform components 106 shown in FIG. 2A, are positioned proximate to the package footing 508. In a similar manner, the platform components 506 shown in FIG. 5 are also positioned proximate to the package footing 108. By positioning the interposer board 512 above the package riser 108 the package riser 108 spaces the interposer board 512 including any components extending away from the perimeters of either of the package riser 108 and the device package 112 such as the interposer flange 514. Accordingly, the interposer flange 514 (further described herein) may readily extend away from the package riser 108 and the remainder of the package assembly 502 without otherwise interfering with platform components 506 provided on the platform 504.

Referring again to FIG. 5, the interposer board 512 is provided with the interposer flange 514 extending outside of the riser perimeter footprint as well as the package perimeter footprint previously described and shown herein. The interposer flange 514 provides a variety of optional features to the package assembly 502 that increase the flexibility of the package assembly 502 and leverages the elevation provided by the package riser 108 to accordingly increase design options for the package assembly 502 including the device package 112. For instance, the interposer flange 514, in one example, includes a cable interface such as a jack, socket or the like configured for coupling with one or more components, diagnostic tools, or the like used with the device package 112. In another example, the interposer flange 514 includes one or more of additional contacts, conductive traces or the like to facilitate the coupling of a device package having a larger or nonstandard footprint relative to the device package 112 shown in FIG. 5. Stated another way, the interposer board 512 provides a series of contacts across at least its upper surface including on the interposer flange 514 as well as the remainder of the board to facilitate the coupling of larger or differently shaped device packages. Because the package riser 108 is used with the package footing 508, the interposer flange 514 is readily elevated above the platform 504 including the proximate platform components 506 to thereby provide an enlarged footing configured for reception of larger or differently shaped device packages thereon. In still another example, the interposer flange 514 provides additional space for circuits, components or the like used for instance with the device package 112. That is to say, the interposer board includes a feature to provide additional space for components for use of the device package 112 and optionally the underlying platform 504. These components may include, but are not limited to, components found on a platform 504 (such as a motherboard) including on or more of resistors, capacitors, additional devices such as CPUs SOCs or the like. In another example, the interposer flange 514 includes circuits including memory or the like found on the platform 504 for use with the device package 112.

As previously described herein, the interposer board 512 is, in one example, provided above the package riser 108 or below the package riser 108 as shown for instance in FIG. 5. By positioning the interposer board 512 above the package riser 108, clearance provided by the package riser 108 for instance by the riser flange 202 (see the flange gap 205 in FIG. 2B) is used to position the interposer flange 514 over top of at least a portion of the platform 504 without otherwise engaging the platform components 506. In another example, the interposer board 512 is itself a riser positioned on the package footing 508 in a manner similar to the package riser 108. That is to say, the interposer board 512 includes one or more contacts along its lower surface configured for coupling along the package footing 508. The riser of the exemplary interposer board elevates the interposer flange above the platform components 506. The intervening package riser 108 shown in FIG. 5 is thereby eliminated from this example. Instead, the interposer board 512 provides the function of the package riser 108 while at the same time providing the additional functionality realized with the interposer flange 514.

Figure 6A:
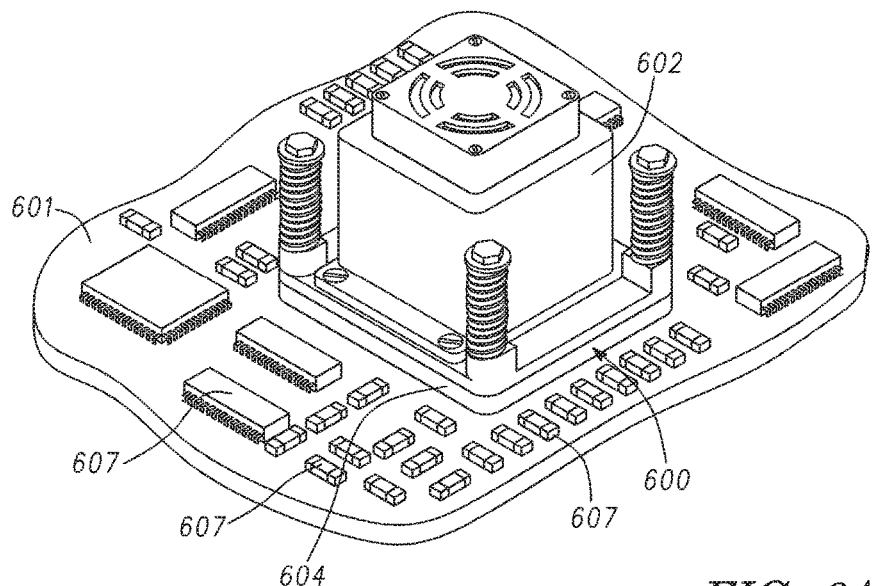
FIG. 6A is a perspective view showing a platform and device package including a socketed interface.
Figure 6B:
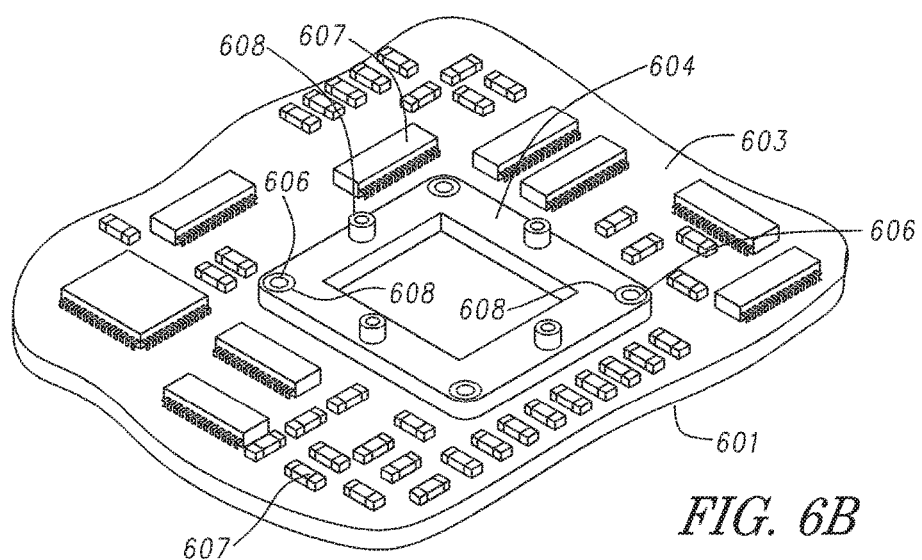
FIG. 6B is a perspective view a socket interface frame.
Figure 6C:
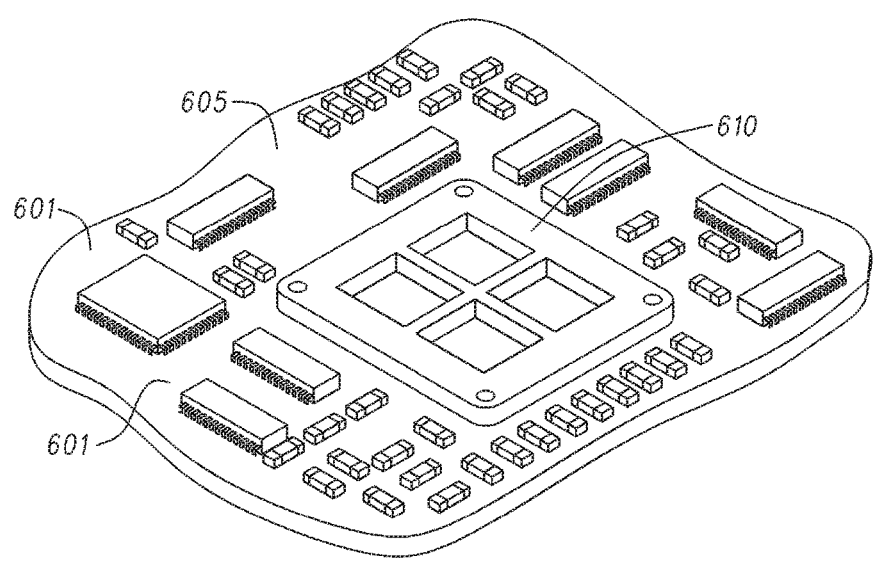
FIG. 6C is a perspective view of a back plate.

FIGS. 6A, 6B, 6C show one example of a socketed interface 600 used with a platform 601. Referring first to FIG. 6A, the platform 601 includes a package fixture 602 including a device package therein coupled on a top frame 604 coupled with the platform 601. As shown, the package fixture 602 and the top frame 604 of the socketed interface 600 provide an increased perimeter footprint of the socketed interface 600 relative to the package assemblies 102, 502 previously described herein. For instance, as shown the device package is contained within the central structure of the package fixture 602 and one or more fastening components including screws, biasing elements such as springs or the like are provided at the outer perimeter of the package fixture 602 for coupling through the top frame 604, for instance through one or more fastener orifices extending there through.

As further shown in FIG. 6B, the package fixture 602 is removed from the platform 601 to expose an exemplary top frame 604 thereon. As shown the top frame 604 includes a plurality of fasteners 606 extending into one or more fastener orifices 608 formed in the platform 601. Additional fastener orifices 608 are also provided for reception of alignment features, coupling features and the like provided on the package fixture 602, for instance in a manner similar to the package fixture 602 shown in FIG. 6A (e.g., with screws, springs or the like). The fastener orifices 608 and the top frame 604 are used with a specifically designed platform 601 configured to couple with the top frame 604 and receive the fasteners. Accordingly, the components 607 of the platform 601 are spaced from the top frame 604 (and the package fixture 602) and the fastener orifices 609 to make room for these features. The components shown in FIGS. 6A and 6B, have an enlarged perimeter footprint relative to the perimeter footprints of the package assemblies 102, 502 described herein. The features of the socketed interface 600 extend beyond the perimeter of the device package and accordingly assume additional space on the platform 601 otherwise used by components.

In one example, the platform 601 is a debugging platform that is specially designed for use (e.g., with spaced components 607, fastening orifices 608 and the like) with the socketed interface 600. Accordingly, another platform (e.g., a production platform) is designed for eventual semi-permanent coupling with a device package directly with the platform, for instance by reflowed solder contacts. The solder coupled device package fixed to the production platform is not readily removable. In the production model (platform), the swappable device packages included in the relatively large package fixture 602 (compared to the package assemblies 102, 502 described herein) are exchanged for semi-permanent coupling with the platform 601 (e.g., with solder contacts). Ready removal of the device package from such a platform is accomplished through mechanical breaking of the solder contacts and cleaning or refurbishing of the package footing for the device package as well as refurbishing of the device package if it will be used again.

Referring now to FIG. 6C, another optional component of a socketed interface 600 is provided. As shown, the second surface 605 of the platform 601 (e.g., a lower surface), in one example, includes a back plate 610. In contrast, the first surface 603 of the platform 601 shown in FIG. 6B includes a top frame 604. The back plate 610 shown in FIG. 6C in one example provides a feature for reception of one or more fasteners, coupling features or the like of the package fixture 602. For instance, the fasteners 606 extending through the platform 601 are optionally received in one or more features of the back plate 610. Additionally, the back plate 610 provides a mechanical structure to the platform 601 to facilitate the ready installation (e.g., including for instance tightening, rotation or the like of fasteners) without otherwise damaging the platform 601. As previously described herein, the use of a back plate 610 (similar to the top frame 604) in some examples assumes space on the platform 601 otherwise used by components (e.g., like the lower components 106 shown in FIG. 2B). The platform 601 with a back plate 610 is thereby designed with components moved to the side or to other locations of the platform 601 to allow for the back plate 610.

Figure 7:
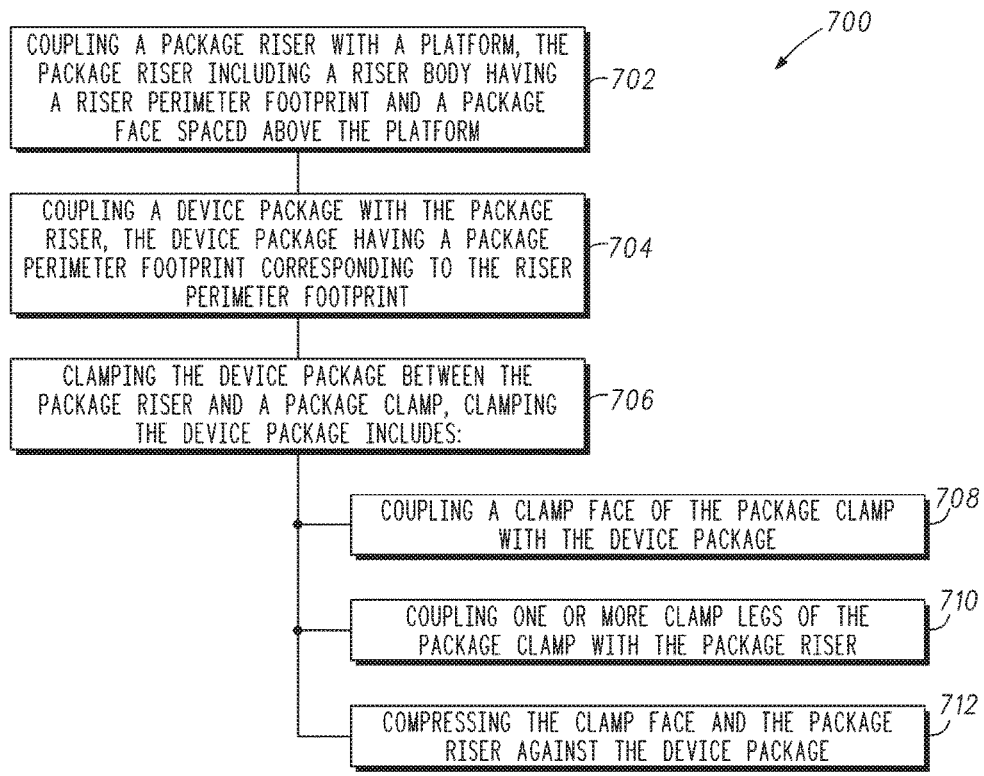
FIG. 7 is a block diagram showing one example of a method for installing a device package on a platform.

FIG. 7 shows one example of a method 700 for installing a device package (e.g., device package 112) on a platform, such as platform 104 described herein. In describing the method 700 reference is made to one or more components, features, functions and steps previously described herein. Where convenient, reference is made to the components, features, steps and the like with reference numerals. Reference numerals provided are exemplary and are nonexclusive. For instance features, functions, steps and the like described in the method 700 include, but are not limited to, the corresponding numbered elements provided herein other corresponding features described herein (both numbered and unnumbered) as well as their equivalents.

At 702, the method 700 includes coupling a package riser 108 with a platform 104. The package riser 108 includes a riser body 202 having a riser perimeter footprint 302 and a package face 210 spaced above the platform 104. As previously described herein, in an example the package riser 108 includes a riser flange 204 extending from the riser body 202 (e.g., laterally). The riser flange 204 is spaced from the platform (and a platform face 208 of the package riser 108) by a flange gap as shown in FIG. 2B.

At 704, a device package 112 is coupled with the platform 104. The device package has a package perimeter footprint 300 corresponding to the riser perimeter footprint 302 (and corresponding to the footing perimeter footprint 304 of the package footing 200). In at least one example, coupling the device package 112 includes positioning the device package 112 on the package riser 108. In other another example, the device package 112 is coupled with the platform 104 with one or more of an interface socket 212, an alignment frame 510 or the like.

At 706, the method 700 includes clamping the device package 112 between the package riser 108 and a package clamp 110. As discussed herein, the device package 112 is compressed between the riser 108 and the package clamp 110 to provide a robust mechanical and electrical coupling with the platform. Clamping the device package includes at 708, coupling a clamp face 222 of the package clamp 110 with the device package 112. For instance, the clamp face 222 is directly engaged with the device package. In another example, the clamp face 222 is indirectly engaged with the device package, for instance with one or more biasing elements 228 as shown in FIGS. 2B and 3. At 710, one or more clamp legs 218 of the package clamp 110 are coupled with the package riser 108. For instance, the one or more clamp legs 218 include clamp hooks 220 configured to couple with the riser flange 204 of the package riser 108. At 712, the clamp face 222 and package riser 108 are compressed against the device package 112. The compression of the device package 112, for instance toward the package riser 108 ensures robust electrical contact is achieved between respective electrical contacts of the components (whether with the package riser 108 directly or with an intervening socket interface 212).

Several options for the method 700 follow. In one example, coupling the device package 112 with the platform 104 includes coupling the device package along a deformable socket interface 212. The deformable socket interface 212 is coupled along the package face 210 of the package riser 108. The deformable socket interface 212 deforms with compression of the clamp face 222 and the package riser 108 against the device package 112 bias electrical contacts therebetween into reliable engagement. In still another example, the method 700 includes electrically interconnecting the device package 112 with the platform 104 through the package riser 108. Stated another way, the package riser 108 provides an elevated interface with the device package 112 and interconnects the package 112 with the platform at the raised location.

In another example, the package clamp 110 includes one or more biasing elements 228 (e.g., one or more springs, elastomeric features or the like). Coupling the clamp face 222 of the package clamp 110 with the device package 112 includes coupling the one or more biasing elements 228 with the device package 112.

In still another example, the method 700 includes installing a replacement device package 112 (e.g., for debugging, with differing performance characteristics or the like). Installing the replacement device package includes unclamping the package clamp 110 from the package riser 108. The original device package 112 is removed from the package riser 108. The replacement device package 112 is coupled with the package riser 108. The replacement device package 112 is clamped between the package riser 108 and the package clamp 110 including coupling the clamp face 222 with the replacement device package 112, and coupling the one or more clamp legs 218 with the package riser 108.

EXAMPLES

Example 1 can include subject matter, such as can include a package assembly comprising: a device package having a package perimeter footprint; a package riser coupled with the device package, the package riser includes: a riser body having a riser perimeter footprint corresponding to the package perimeter footprint, the riser body includes a package face coupled with the device package and an opposed platform face, and a riser flange proximate the package face, the riser flange extends from the riser body; a package clamp coupled with the device package and the package riser, the package clamp includes: a clamp face coupled with the device package, and one or more clamp legs clamped to the riser flange; and the device package is clamped between the clamp face and the package face.

Example 2 can include, or can optionally be combined with the subject matter of Example 1, to optionally include the riser flange is spaced from the platform face.

Example 3 can include, or can optionally be combined with the subject matter of one or any combination of Examples 1 or 2 to optionally include a platform with a package area having a package area perimeter footprint corresponding to the package perimeter footprint, the platform face of the package riser is coupled with the package area; and one or more components coupled with the platform, the one or more components proximate the package area and underlying the riser flange.

Example 4 can include, or can optionally be combined with the subject matter of one or any combination of Examples 1-3 to optionally include at least a portion of the one or more clamp legs is between the riser flange and the one or more components.

Example 5 can include, or can optionally be combined with the subject matter of one or any combination of Examples 1-4 to optionally include a deformable socket interface between the clamp face of the package clamp and the package face of the package riser.

Example 6 can include, or can optionally be combined with the subject matter of Examples 1-5 to optionally include the package clamp includes one or more biasing elements coupled with the clamp face, and the one or more biasing elements bias the device package toward the package face of the package riser.

Example 7 can include, or can optionally be combined with the subject matter of Examples 1-6 to optionally include the package clamp includes a coupling operator coupled with the one or more clamp legs, and the coupling operator is configured to move the one or more clamp legs toward the package riser.

Example 8 can include, or can optionally be combined with the subject matter of Examples 1-7 to optionally include the package clamp includes a clamp operator, and the clamp operator is configured to bias the device package toward the package face of the package riser.

Example 9 can include, or can optionally be combined with the subject matter of Examples 1-8 to optionally include the package riser includes a plurality of conductive traces and a corresponding plurality of contacts along each of the package and platform faces, and the conductive traces electrically interface the device package with a platform.

Example 10 can include, or can optionally be combined with the subject matter of Examples 1-9 to optionally include an interposer board coupled with one of the package face or the platform face, the interposer board includes an interposer flange having a plurality of conductive traces and conductive contacts, and the interposer flange extends outside of the package perimeter footprint and the riser perimeter footprint.

Example 11 can include, or can optionally be combined with the subject matter of Examples 1-10 to optionally include a package coupling system comprising: a package riser configured for interpositioning between a platform and a device package, the package riser includes: a riser body having a platform face with a first plurality of riser contacts and an opposed package face including a second plurality of riser contacts in communication with the first plurality of riser contacts, and a riser flange proximate the package face, the riser flange extends from the riser body; a package clamp including: a clamp face configured for coupling with the device package, and one or more clamp legs extending from the clamp face; and in an installed configuration the device package is clamped between the clamp face and the package face and the one or more clamp legs are coupled with the riser flange.

Example 12 can include, or can optionally be combined with the subject matter of Examples 1-11 to optionally include a deformable socket interface between the clamp face of the package clamp and the package face of the package riser.

Example 13 can include, or can optionally be combined with the subject matter of Examples 1-12 to optionally include the package clamp includes one or more biasing elements coupled with the clamp face, in the installed configuration the one or more biasing elements bias the device package toward the package face of the package riser.

Example 14 can include, or can optionally be combined with the subject matter of Examples 1-13 to optionally include the one or more biasing elements includes one or more springs.

Example 15 can include, or can optionally be combined with the subject matter of Examples 1-14 to optionally include the riser flange is spaced from the platform face.

Example 16 can include, or can optionally be combined with the subject matter of Examples 1-15 to optionally include the one or more clamp legs each include a clamp hook, and in the installed configuration the clamp hooks of the one or more clamp legs are engaged along a lower surface of the riser flange.

Example 17 can include, or can optionally be combined with the subject matter of Examples 1-16 to optionally include the package clamp includes a coupling operator coupled with the one or more clamp legs, and the coupling operator is configured to move the one or more clamp legs toward the package riser.

Example 18 can include, or can optionally be combined with the subject matter of Examples 1-17 to optionally include the package clamp includes a clamp operator, and clamp operator is configured to bias the device package toward the package face of the package riser.

Example 19 can include, or can optionally be combined with the subject matter of Examples 1-18 to optionally include the device package; and the platform.

Example 20 can include, or can optionally be combined with the subject matter of Examples 1-19 to optionally include a method of installing a device package on a platform comprising: coupling a package riser with a platform, the package riser including a riser body having a riser perimeter foot print and a package face spaced above the platform; coupling a device package with the package riser, the device package having a package perimeter footprint corresponding to the riser perimeter footprint; and clamping the device package between the package riser and a package clamp, clamping the device package includes: coupling a clamp face of the package clamp with the device package, coupling one or more clamp legs of the package clamp with the package riser, and compressing the clamp face and the package riser against the device package.

Example 21 can include, or can optionally be combined with the subject matter of Examples 1-20 to optionally include coupling the device package with the package riser includes coupling the device package along a deformable socket interface, the deformable socket interface coupled along the package face, and the deformable socket interface deforms with compression of the clamp face and the package riser against the device package.

Example 22 can include, or can optionally be combined with the subject matter of Examples 1-21 to optionally include coupling one or more clamps legs includes hooking the one or more clamp legs on a riser flange coupled with the riser body.

Example 23 can include, or can optionally be combined with the subject matter of Examples 1-22 to optionally include the package clamp includes one or more biasing elements, and coupling the clamp face of the package clamp with the device package includes coupling the one or more biasing elements with the device package.

Example 24 can include, or can optionally be combined with the subject matter of Examples 1-23 to optionally include electrically interconnecting the device package with the platform through the package riser.

Example 25 can include, or can optionally be combined with the subject matter of Examples 1-24 to optionally include installing a replacement device package, installing the replacement device package includes: unclamping the package clamp from the package riser, removing the device package from the package riser, coupling the replacement device package with the package riser, and clamping the replacement device package between the package riser and the package clamp including coupling the clamp face with the replacement device package, and coupling the one or more clamp legs with the package riser.

The invention claimed is:

1. A package assembly comprising: a device package having a package perimeter footprint; a package riser coupled with the device package, the package riser includes: a riser body having a riser perimeter footprint corresponding to the package perimeter footprint, the riser body includes a package face coupled with the device package and an opposed platform face, and a riser flange proximate the package face, the riser flange extends from the riser body; a package clamp coupled with the device package and the package riser, the package clamp includes: a package cavity, the device package within the package cavity, a clamp face within the package cavity, the clamp face coupled with the device package, and a plurality of clamp legs coupled to the riser flange, the plurality of clamp legs extend around the package cavity and an entire plurality of sides of the package perimeter footprint; and the device package is clamped between the clamp face and the package face with the clamp legs extending around the entire plurality of sides of the package perimeter footprint.

2. The package assembly of claim 1, the riser flange is spaced from the platform face.

3. The package assembly of claim 2 comprising:
a platform with a package area having a package area perimeter footprint corresponding to the package perimeter footprint, the platform face of the package riser is coupled with the package area; and
one or more components coupled with the platform, the one or more components proximate the package area and underlying the riser flange.

4. The package assembly of claim 3, at least a portion of the plurality of clamp legs is between the riser flange and the one or more components.

5. The package assembly of claim 1 comprising a deformable socket interface between the clamp face of the package clamp and the package face of the package riser.

6. The package coupling system of claim 1, the package clamp includes one or more biasing elements coupled with the clamp face, and the one or more biasing elements bias the device package toward the package face of the package riser.

7. The package coupling system of claim 1 the package clamp includes a coupling operator coupled with the plurality of clamp legs, and the coupling operator is configured to move the plurality of clamp legs toward the package riser.

8. The package coupling system of claim 1, the package clamp includes a clamp operator, and the clamp operator is configured to bias the device package toward the package face of the package riser.

9. The package coupling system of claim 1, the package riser includes a plurality of conductive traces and a corresponding plurality of contacts along each of the package and platform faces, and the conductive traces electrically interface the device package with a platform.

10. The package coupling system of claim 1 comprising an interposer board coupled with one of the package face or the platform face, the interposer board includes an interposer flange having a plurality of conductive traces and conductive contacts, and the interposer flange extends outside of the package perimeter footprint and the riser perimeter footprint.

11. The package assembly of claim 1, wherein the plurality of clamp legs extend continuously around the entire package perimeter footprint.

12. A package coupling system comprising: a package riser configured for interpositioning between a platform and a device package, the package riser includes: a riser body having a platform face with a first plurality of riser contacts and an opposed package face including a second plurality of riser contacts in communication with a riser flange proximate the package face, the riser flange extends from the riser body and the riser flange includes a plurality of sides extending entirely around the riser body; a package clamp including: a clamp face configured for coupling with the device package, a plurality of clamp legs extending from the clamp face; and in an installed configuration the device package is clamped between the clamp face and the package face, the plurality of clamp legs extend along the entire plurality of sides of the riser flange, and the plurality of clamp legs are coupled with the riser flange.

13. The package coupling system of claim 12 comprising a deformable socket interface between the clamp face of the package clamp and the package face of the package riser.

14. The package coupling system of claim 12, the package clamp includes one or more biasing elements coupled with the clamp face, in the installed configuration the one or more biasing elements bias the device package toward the package face of the package riser.

15. The package coupling system of claim 14, the one or more biasing elements includes one or more springs.

16. The package coupling system of claim 12, the riser flange is spaced from the platform face.

17. The package coupling system of claim 12, the plurality of clamp legs each include a clamp hook, and in the installed configuration the clamp hooks of the plurality of clamp legs are engaged along a lower surface of the riser flange.

18. The package coupling system of claim 12, the package clamp includes a coupling operator coupled with the plurality of clamp legs, and the coupling operator is configured to move the plurality of clamp legs toward the package riser.

19. The package coupling system of claim 12, the package clamp includes a clamp operator, and clamp operator is configured to bias the device package toward the package face of the package riser.

20. The package coupling system of claim 12, wherein the riser flange continuously extends entirely around the riser body, and the plurality of clamp legs continuously extend along the entire riser flange.

21. A method of installing a device package on a platform comprising: coupling a package riser with a platform, the package riser including a riser body having a riser perimeter foot print and a package face spaced above the platform; coupling a device package with the package riser, the device package having a package perimeter footprint corresponding to the riser perimeter footprint; and clamping the device package between the package riser and a package clamp, clamping the device package includes: coupling a clamp face of the package clamp with the device package, the device package within a package cavity of the package clamp, coupling a plurality of clamp legs of the package clamp with the package riser, the plurality of clamp legs surround the package cavity and an entire plurality of sides of the package perimeter footprint, and compressing the clamp face and the package riser against the device package.

22. The method of claim 21, coupling the device package with the package riser includes coupling the device package along a deformable socket interface, the deformable socket interface coupled along the package face, and the deformable socket interface deforms with compression of the clamp face and the package riser against the device package.

23. The method of claim 21, coupling the plurality of clamps legs includes hooking the plurality of clamp leas on a riser flange coupled with the riser body.

24. The method of claim 21, the package clamp includes one or more biasing elements, and coupling the clamp face of the package clamp with the device package includes coupling the one or more biasing elements with the device package.

25. The method of claim 21 comprising electrically interconnecting the device package with the platform through the package riser.

26. The method of claim 21 comprising installing a replacement device package, installing the replacement device package includes: unclamping the package clamp from the package riser, removing the device package from the package riser, coupling the replacement device package with the package riser, and clamping the replacement device package between the package riser and the package clamp including coupling the clamp face with the replacement device package, and coupling the plurality of clamp legs with the package riser.

27. The method of claim 21, wherein coupling the plurality of clamp legs with the package riser includes coupling the plurality of clamp legs with the package riser, the plurality of clamp legs continuously surround the entire package perimeter footprint.

* * * * *